United States Patent [19]

Scifres et al.

[11] 4,219,785
[45] Aug. 26, 1980

[54] OPTICAL BEAM SCANNING BY PHASE DELAYS

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 918,740

[22] Filed: Jun. 26, 1978

[51] Int. Cl.² .............................................. H01S 3/19
[52] U.S. Cl. ........................ 331/94.5 H; 331/94.5 K; 357/18
[58] Field of Search ..................... 331/94.5 H, 94.5 K; 332/7.51; 357/18

[56] References Cited

U.S. PATENT DOCUMENTS

| | | | |
|---|---|---|---|
| 3,436,679 | 4/1969 | Fenner | 331/94.5 K |
| 3,626,321 | 12/1971 | Smith | 331/94.5 K |
| 3,691,483 | 9/1972 | Klein | 332/7.51 |
| 3,701,044 | 10/1972 | Paoli et al. | 331/94.5 H |
| 4,159,452 | 6/1979 | Logan et al. | 331/94.5 H |

*Primary Examiner*—James W. Davie
*Attorney, Agent, or Firm*—Leonard Zalman

[57] ABSTRACT

A light beam scanner of the moving interference fringe pattern type which includes a body of semiconductor material having a source of coherent radiation and wave guides for guiding the coherent radiation along a plurality of spatially displaced paths which are optically uncoupled, and means associated with the spatially displaced paths for producing relative phase changes between radiation in the different paths whereby interference fringes in the far field are spatially scanned. In addition, wavelength modulation of the laser over a range of about 80 Å can be achieved. The source of the coherent radiation can be a single laser or a plurality of optically coupled lasers, and the optical uncoupling can be achieved by spatial displacement of the paths or by insertion of a high loss medium between the paths.

13 Claims, 11 Drawing Figures

OPTICAL BEAM SCANNING BY PHASE DELAYS

BACKGROUND OF THE INVENTION

Laser scanning has been achieved by the mechanical motion of a prism or mirror on which a coherent optical beam is incident and by the use of acousto-optic crystals which utilize ultrasonic wave propagation to diffract a coherent optical beam. The mechanical or propagating acoustic wave nature of the prior art limits the scanning speed of such devices, or adversely affects their reliability or economic utilization.

More recently, optical scanners have been proposed which utilize the movement of an interference pattern across an image or target trace. In U.S. Pat. No. 3,626,321 a moving interference pattern is achieved by a system that utilizes a plurality of discrete gas lasers to produce a plurality of coherent light beams with ordered geometrical intervals and frequency differentials from each other, the phased relationships between the beams providing the moving interference pattern. In U.S. Pat. No. 3,691,483, a phase-locking laser, an array of variable phase shifters, an array of semiconductor lasers and a control computer are utilized to provide a moving interference pattern for optical scanning. The moving interference fringe scanning systems alluded to require precise alignments, spacings and frequency control of a plurality of discrete components and require phase delay elements outside of the laser cavity.

The problems encountered with discrete component systems are not present in the solid state scanning system of U.S. Pat. No. 3,701,044 to Paoli et al. In the Paoli et al system a plurality of parallel strip electrical contacts are provided on one surface of a rectifying junction diode, the contacts being so spaced that the optical fields produced by adjacent lasing areas are optically coupled to produce a locked oscillation, that is, a composite beam. Paoli et al states that by introducing phase shifts between adjacent optically coupled lasing areas, the direction of the composite beam is changed to produce scanning. The Paoli et al system does not teach decoupling of the composite beam produced by adjacent optically coupled lasers thereof and hence cannot provide relative phase shifting of different optical fields.

OBJECTS OF THE INVENTION

It is an object of the present invention to provide a laser scanning system.

It is a further object of the present invention to provide a laser scanning system by movement of an interference fringe pattern.

It is a still further object of the present invention to provide a laser scanning system which provides movement of an interference fringe pattern by decoupling laser oscillations and applying relative phase shifts to the resulting decoupled laser oscillations.

It is a still further object of the present invention to provide a laser scanner utilizing interference fringe rotation produced by a plurality of light emitting regions.

It is another object of the present invention to provide a device having wavelength modulation.

SUMMARY OF THE INVENTION

In accordance with the invention there is provided a light beam scanner of the moving interference fringe pattern type which includes a body of semiconductor material having a source of coherent radiation and wave guides for guiding the coherent radiation along a plurality of spacially displaced paths which are optically uncoupled, and means associated with the wave guides for producing relative phase changes between the radiation in the different paths whereby interference fringes in the far field are spatially scanned. Also, wavelength modulation of the laser over a range of about 80 Å can be achieved. The source of the coherent radiation can be a single laser or a plurality of optically coupled lasers, and the optical uncoupling can be achieved by spatial displacement of the wave guides or by insertion of a high optical loss medium or optically isolating medium between the wave guides.

DETAILED DESCRIPTION OF THE INVENTION

Figure 1:
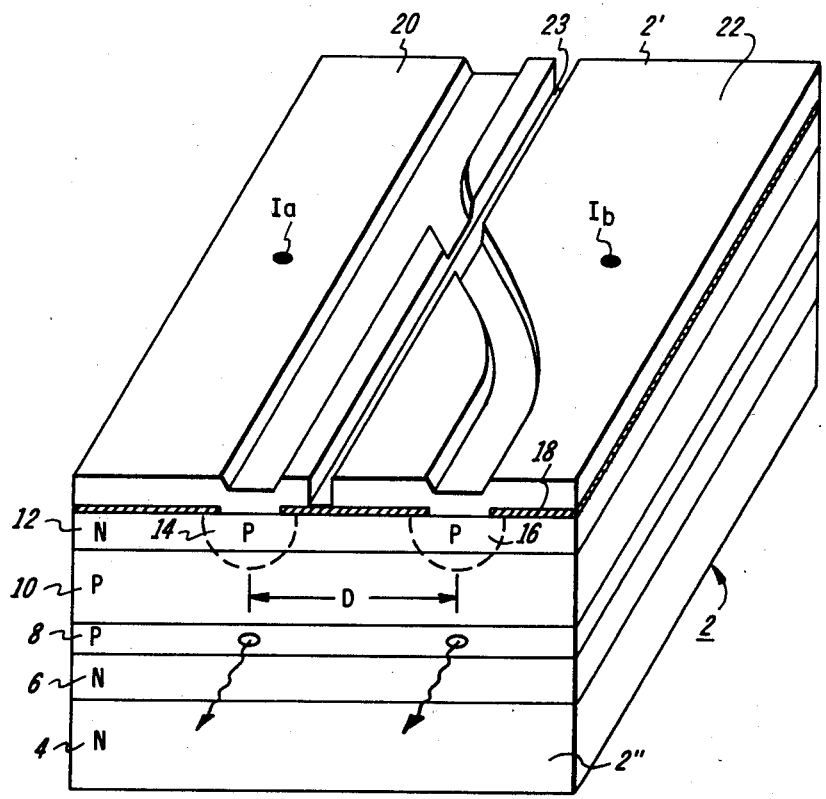
FIG. 1 is a schematic diagram of an optical scanner in accordance with the invention.

Referring now to FIG. 1, there is shown a schematic of one type of solid state, interference fringe pattern type scanner in accordance with the invention. The scanner includes a solid state body 2 comprised of an n-type gallium-arsenide substrate 4, an n-type gallium aluminum arsenide light confining layer 6, a p-type gallium arsenide active region layer 8, a p-type gallium aluminum arsenide light confining layer 10, and an n-type contact facilitating layer 12. A p-type region 14 extends through layer 12 to layer 10 to define thereBeneath a straight light wave guide or emitting region which extends from the far face 2' to the near face 2" of the body 2. Branching from the region 14 is another p-type region 16 which also extends through layer 12 to layer 10 to define thereBeneath a branching light wave guide or emitting region which also extends from face 2' to face 2". Electrode 20 contacts the p-type region 14 over its entire length to provide a means for electrical pumping of the straight light emitting region and electrode 22 contacts p-type portion 16 to provide, along with a portion of electrode 20, a means for pumping the branch light emitting region. Contacts 20 and 22 are separated at 23. Regions of electrical insulating material 18 insulate the n-type portions of layer 12 from the contacts 20 and 22. The far face 2' and the near face 2" of the body 2 are cleaved or mirrored to provide a resonant cavity.

Figure 2:
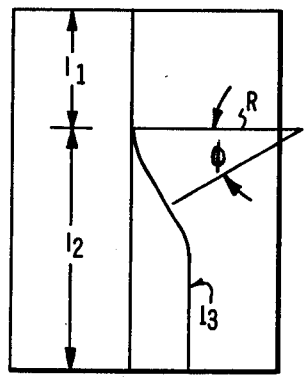
FIG. 2 is a diagram of the wave guides of the scanner of FIG. 1.

Referring now to FIGS. 1 and 2, the wave guide pattern, as noted, consists of one straight light emitting region or wave guide and one curved or branched light emitting region or wave guide. The wave guides, which, for example, can be 4 microns wide, overlap completely at the far end of the laser for length $l_1$. A bifurcation occurs at this distance from the rear face 2', the branching wave guide gradually separating from the straight wave guide over one portion of its length and then bending again to parallel the straight wave guide. For example, as shown in FIG. 2, the radius R can be approximately 1 mm and the angle $\phi$ can be approximately 9.37 degrees. The length of the straight wave guide from the bifurcation to the face 2'' is $l_2$, and the length of the branching wave guide from the bifurcation to face 2'' is $l_3$. As shown, a pump current $I_a$ pumps both $l_1$ and $l_2$ via electrode 20, whereas pump current $I_b$ is applied via electrode 22 only to $l_3$. The separation between the two wave guides is denoted by D in FIG. 1, such separation D must be sufficient to decouple the optical field intensity pattern in $l_2$ from the optical field intensity pattern in $l_3$.

Figure 3:
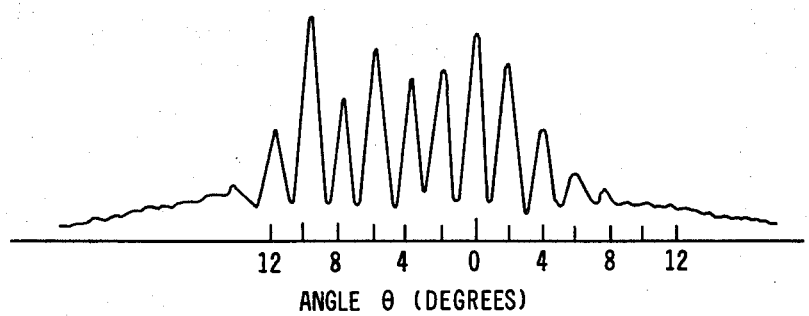
FIG. 3 is a far field radiation pattern for the scanner of FIG. 1.

Under pulsed operation with $I_a = I_b = 205$ mA for a laser with $l_1 = 140$ um, $l_2 = 350$ um, $l_3 = 351$ um, and $D = 25$ um, the far field radiation pattern of FIG. 3 will be produced by the device of FIG. 1. The peaks of the far field pattern, which is observed in a plane orthogonal to the plane of the pn junction between layers 6 and 8, have an approximate angular spacing of $\Delta\theta \approx 2°$. A laser similar to that of FIG. 1 but with D approximately equal to 47 um produced far field peaks with $\Delta\theta \approx 1.2°$. The far field patterns produced show conclusively that the peaks are produced by interference from two separate coherent sources. It is noted here that since the branching wave guide and the straight wave guide have a common portion $l_1$, the light is only optically decoupled over portions $l_2$ and $l_3$ which occurs due to the separation D between $l_2$ and $l_3$.

Further evidence that the fringes are produced by interference between two light waves is shown by FIG. 3. With $I_a$ approximately equal to $I_b$, the fringe visibility depicted in FIG. 3 is quite high; specifically $I_{max}/I_{min}$ is approximately 10. There are several reasons for the imperfect null. First, the scanner aperture resolution of 0.26 degrees is not infinitesimal. Second, the laser output spectrum has a half-power width of approximately 14 angstroms, and the fringe spacing depends on wavelength. Thirdly, the output optical intensities and phase fronts from $l_2$ and $l_3$ are not identical. Obviously, with $I_b = 0$, no fringes are observed, but when both contacts 20 and 22 are excited and the relative currents varied, the fringes are observed to shift continuously. In effect, the fringe pattern angularly scans.

The scanning of the interference pattern results from independently varying the pump current to each of the wave guides, the variation in pump current producing a relative change in refractive index between the straight and branching wave guides. As is well known, the relative change in refractive index induces a relative phase shift between the light in the straight and branching wave guides and that relative phase shifting causes the interference fringe pattern to rotate. It should also be noted that since the phase shifting elements are within the laser cavity wavelength modulation of the laser over a range of about 80 Å is observed. This modulation is associated with changes in optical path length of the branched elements because of the index modulation. Any laser structure of the type described which has its phase shifting elements within the laser cavity (inside the mirrors) will exhibit similar electrically controlled wavelength modulation.

There are several ways to produce the relative change in refractive index that produces the relative phase shift resulting in a rotating interference fringe pattern and wavelength modulation. One way is that previously described, wherein electrical charges are injected into the wave guides. These extra charges cause a change in refractive index which is dependent on the number of the charges that are injected. Another way to effect relative phase change is to remove electrical charge from the wave guides; the charge removal occuring when a voltage is applied such that the charges in the wave guide layer migrate toward or away from the biasing electrode. This second effect is implemented by reverse biasing a rectifying junction or by a metal-insulator-semiconductor contact. Other methods for modification of refractive index include the application of strain via acoustic waves and thermal effects. Any of the described phase shifting techniques and others known to those skilled in the art can be used to effect the relative phase shift between the light in the straight wave guide and the light in the branching wave guide.

As noted, the scanning of the interference pattern results from an electrically induced optical phase shift of the light in one wave guide relative to the light in the other wave guide. When $I_b$ is increased relative to $I_a$, the interference pattern shifts toward $l_3$, so that in effect the refractive index of $l_3$ has been increased relative to that of $l_2$. To study the scanning effect, the far field intensity pattern was plotted (FIG. 4), by means of a split detector placed at an angle of approximately 4 degrees relative to one of the cleaved faces, as the ratio $I_a/I_b$ was varied with $I_a + I_b$ held constant at approximately 235 mA. Aside from the periodic characteristic of the curve which indicates the movement of the fringes across the detector, the detected intensity also increases with $I_a$. Moreover, when $I_b$ is decreased below approximately 50 mA, the light intensity emitted from $l_3$ is so much less than that produced by $l_2$ that the interference fringe visibility becomes rather low. Eventually, all that remains is the far-field pattern of the light in the straight wave guide.

Figure 4:
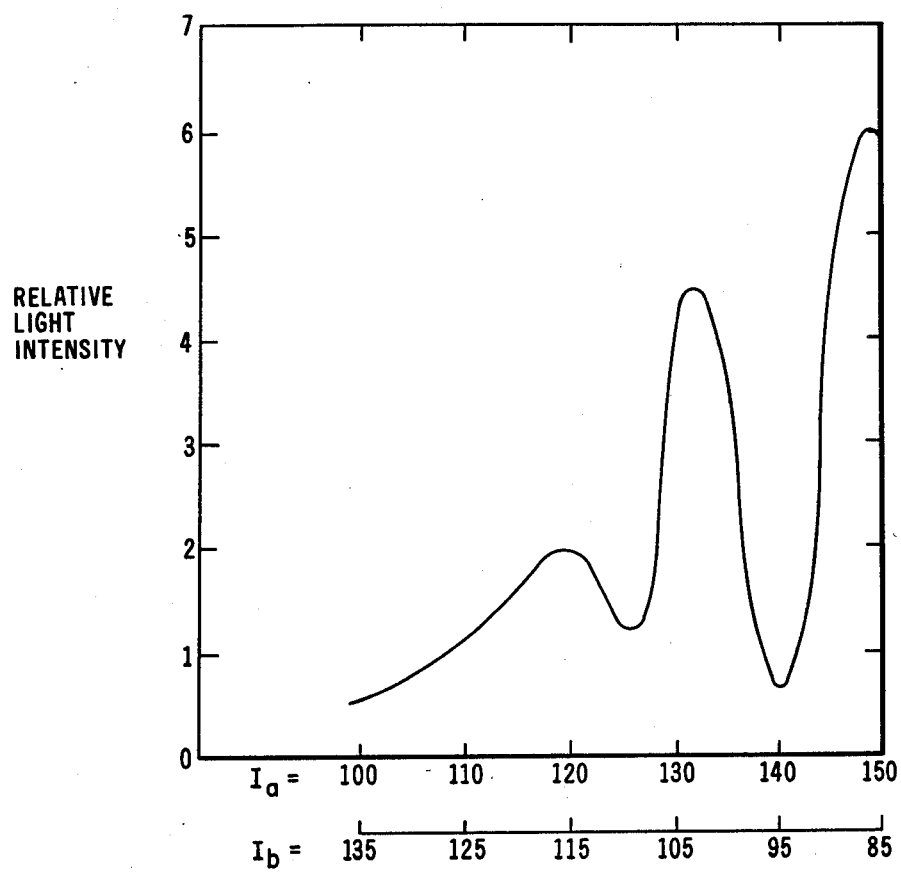
FIG. 4 depicts detected light intensity when interference fringes are scanned past an apertured detector as pump current ratios are changed.

Although the abscissa in FIG. 4 is labeled with the total currents $I_a$ and $I_b$, the current densities differ even when $I_a = I_b$, since the contact area for $I_a$ exceeds that for $I_b$. Specifically, with $I_a = 100$ mA and $I_b = 135$ mA, we estimate that $J_a \approx 5.1$ kA/cm$^2$ and $J_b \approx 9.6$ kA/cm$^2$, and for $I_a = 150$ mA and $I_b = 85$ mA, $J_a \approx 7.6$ kA/cm$^2$ and $J_b \approx 6$ kA/cm$^2$. The lowest null in FIG. 4 appears to occur with $I_a = 140$ mA and $I_b = 95$ mA. These currents correspond to approximately equal current densities of 7.1 kA/cm$^2$ and 6.8 kA/cm$^2$ in $l_2$ and $l_3$, respectively. Under these conditions one might expect approximately equal light emitted from the two wave guides.

The total angular scan depicted in FIG. 4 is roughly 4.2 degrees or two fringes. Thus, the phase difference induced over this current range is approximately two wavelengths. Since $l_2 + l_3 = 700$ um and this result implies $k_o \Delta n (l_2 + l_3) = 4\pi$, we find that the refractive index change must be $\Delta n = 2.3 \times 10^{-3}$.

Figure 5:
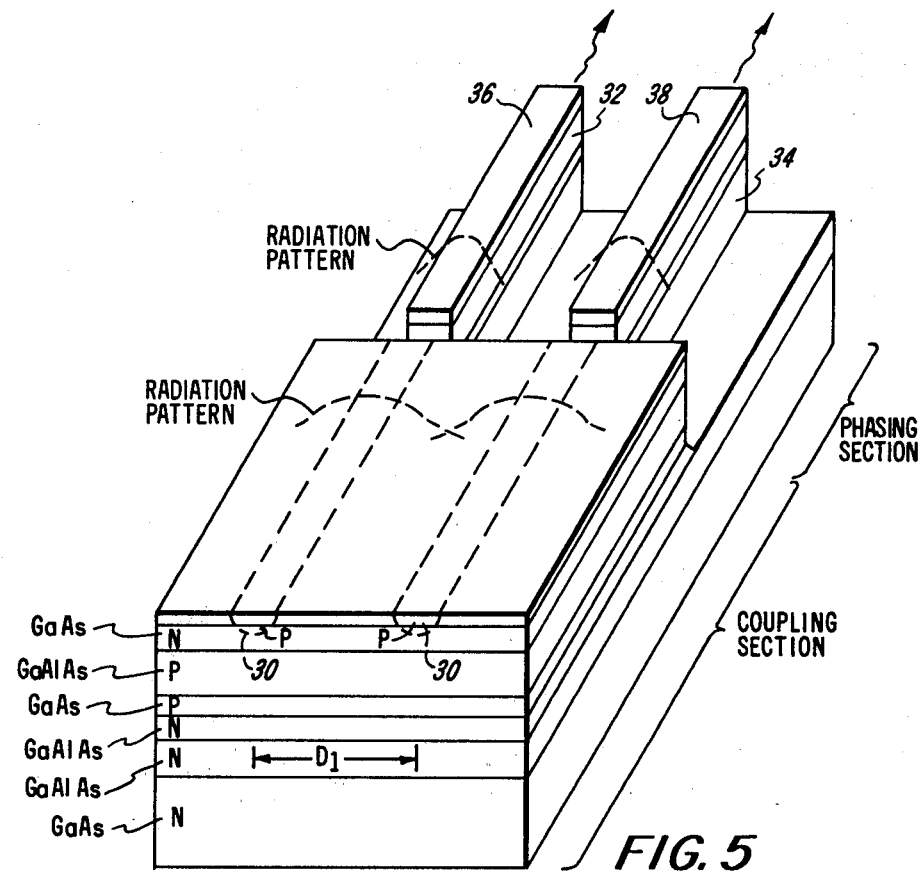
FIG. 5 is a schematic diagram of another optical scanner in accordance with the invention.

In the device of FIG. 1, the straight wave guide and the branching wave guide have a common or coupling portion $l_1$ and hence the light produced in section $l_1$ of each wave guide is coherent. The coherent light source can be a plurality of light emitting regions so located relative to each other that their output radiation patterns overlap resulting in coupling and coherent operation of the plural light emitting regions at the same optical frequency. Such a device is shown in FIG. 5 wherein the light emitting waveguide regions of the n-type GaAs layer pumped via p-type areas 30 are separated by a distance $D_1$ which permits the output radiation patterns of the pumped regions to overlap, as shown. Accordingly, the plural pumped regions are optically coupled and the pumped regions of the coupling section produces light of the same frequency.

In the device of FIG. 1, the distance D separating $l_2$ and $l_3$ was sufficiently large that the light was decoupled in portions $l_2$ and $l_3$. Decoupling can be achieved by means other than distance, such as the decoupling structure shown in FIG. 5 wherein the uncoupled light is guided by mesa-like structures 32 and 33 which are built up upon the semiconductor substrate and which are surrounded by air. The relatively low refractive index of air causes the light in the mesa structures of the phasing section to be decoupled thereby permitting relative phase shifting by electrodes 36 and 38 and interference pattern rotation.

Figure 7:
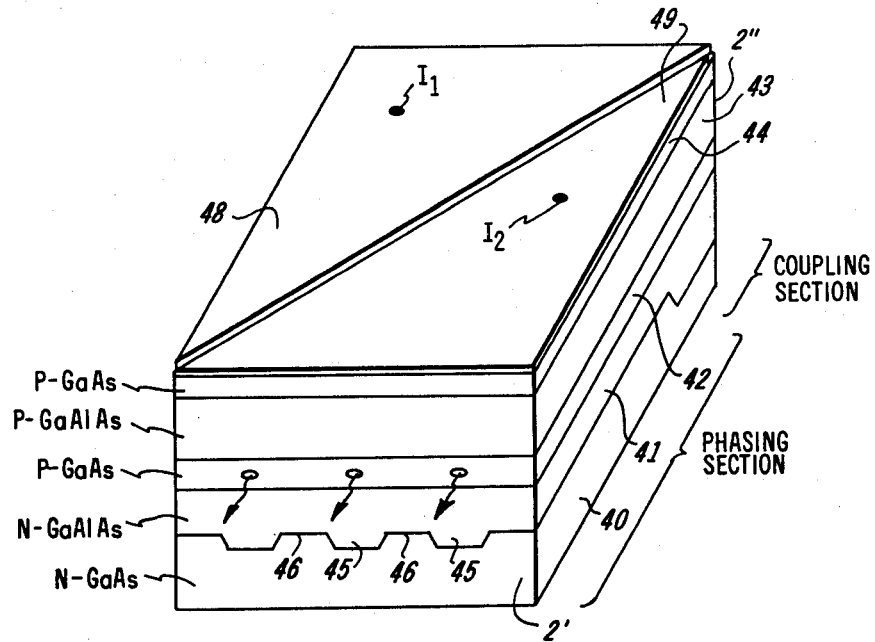
FIGS. 7 and 7a depict another optical scanner in accordance with the invention.
Figure 7A:
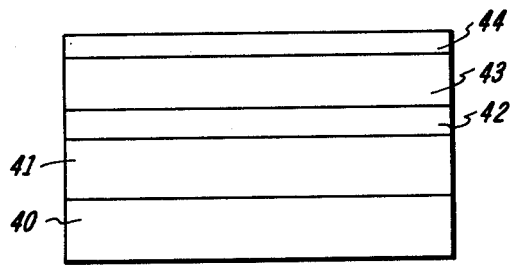

Optical decoupling is also provided by the device of FIG. 7 wherein parallel channels 45 are etched into the portion of the substrate 40 within the phasing section prior to growth of layers 41, 42, 43, and 44 which can have the conductivity types and compositions indicated. The channels provide mesa regions 46 therebetween. The far face 2" and the near face 2' of the device of FIG. 7 are cleaved or mirrored to provide resonant cavities. As explained in copending U.S. Patent Application Ser. No. 806,395, filed June 13, 1977 in the names of Robert D. Burnham and Donald R. Scifres, when the structure of FIG. 7 is pumped (as explained hereinafter) only the portions of the active region 42 above the etched channels 45 will lase and produce coherent optical waves; the higher refractive index of the mesa regions 46 attenuate the optical waves above the mesa to provide decoupling of the optical waves at the output face 2'. A coupling section is formed in the device of FIG. 7 by etching the substrate in the coupling section so that there are no mesas in the coupling section as shown in FIG. 7a. Carrier injection needed for lasing is provided by separate contacts 48 and 49, each of which covers a segment of each portion of the active region that lases. By pumping electrodes 48 and 49 with currents $I_1$ and $I_2$ having different magnitudes, different indices of refraction are provided in the phasing section of the different lasing areas, with the difference in refractive index causing the relative phase shifting that provides output beam scanning in the manner previously described.

The laser light sources of the devices of FIGS. 1 and 5 are of the double heterostructure type. Other laser light sources can also be utilized including distributed feedback, buried heterostructure, single heterostructure and others well known in the art. Also, the wave guides can be of a type other than those of FIGS. 1 and 5, such as the graded index type, step index type and the gain type to note just a few examples. The wave guides can be formed by ion implantation diffusion, chemical etching, preferential crystal growth, sputtering, ion beam milling or any other suitable means. In all cases, the coherent light produced is split off and guided in different spatially displaced (uncoupled) regions of the semiconductor body.

Fabrication of the branching strip configuration of FIG. 1 will follow conventional techniques, as will fabrication of the device of FIG. 5. Referring to FIG. 1, the layers 6, 8, 10 and 12 are grown on substrate 4 by liquid phase epitaxy or other equivalent growth techniques. After depositing the electrical insulating material 18, such as silicon nitride, on the top face of the grown wafer, the branching strip pattern is formed in material 18 by photolithography and plasma etch techniques or equivalent techniques. Next, a p-type impurity, such as zinc, is difused to a depth of approximately 0.5 microns to convert the n-type gallium arsenide top layer 12 to p-type in the region beneath the strip opening to form stripes 14 and 16. A chrome (200 angstrom)-/gold (2500 angstrom) contact layer, or a contact layer of any suitable material, is then evaporated onto the p-side of the device. Finally, the portion of the contact layer that defines separation 23 is removed along the entire length of the laser, thereby allowing the contacts 20 and 22 of the interferrometric scanner to be independently pumped. The width of separation 23 can be three microns such that the resistance between contacts 20 and 22 is roughly 80 to 100 ohms for a 500 micron long device.

Figure 6:
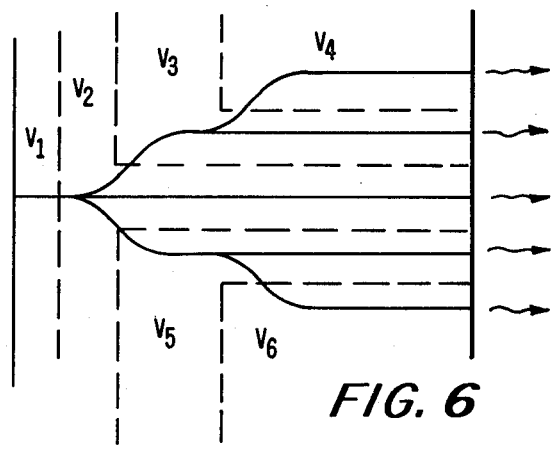
FIG. 6 depicts a scanner with multiple uncoupled wave guides.

Although only a single branching is achieved by the device of FIG. 1, multiple branching is contemplated with the achievement of 3 or more uncoupled light beams as shown in the wave guide array of FIG. 6 which produces five uncoupled output beams when the voltage $V_1$ through $V_6$ are supplied. In all cases however, the light beams must originate from a single source or a plurality of sources that are optically coupled. Also, the device of FIG. 5 can have more than two mesa structures and more than two coupled light sources. Also, the coupling section of the device of FIG. 1 can be used with the phasing section of the device of FIG. 5 and vis-a-versa.

Figure 8:
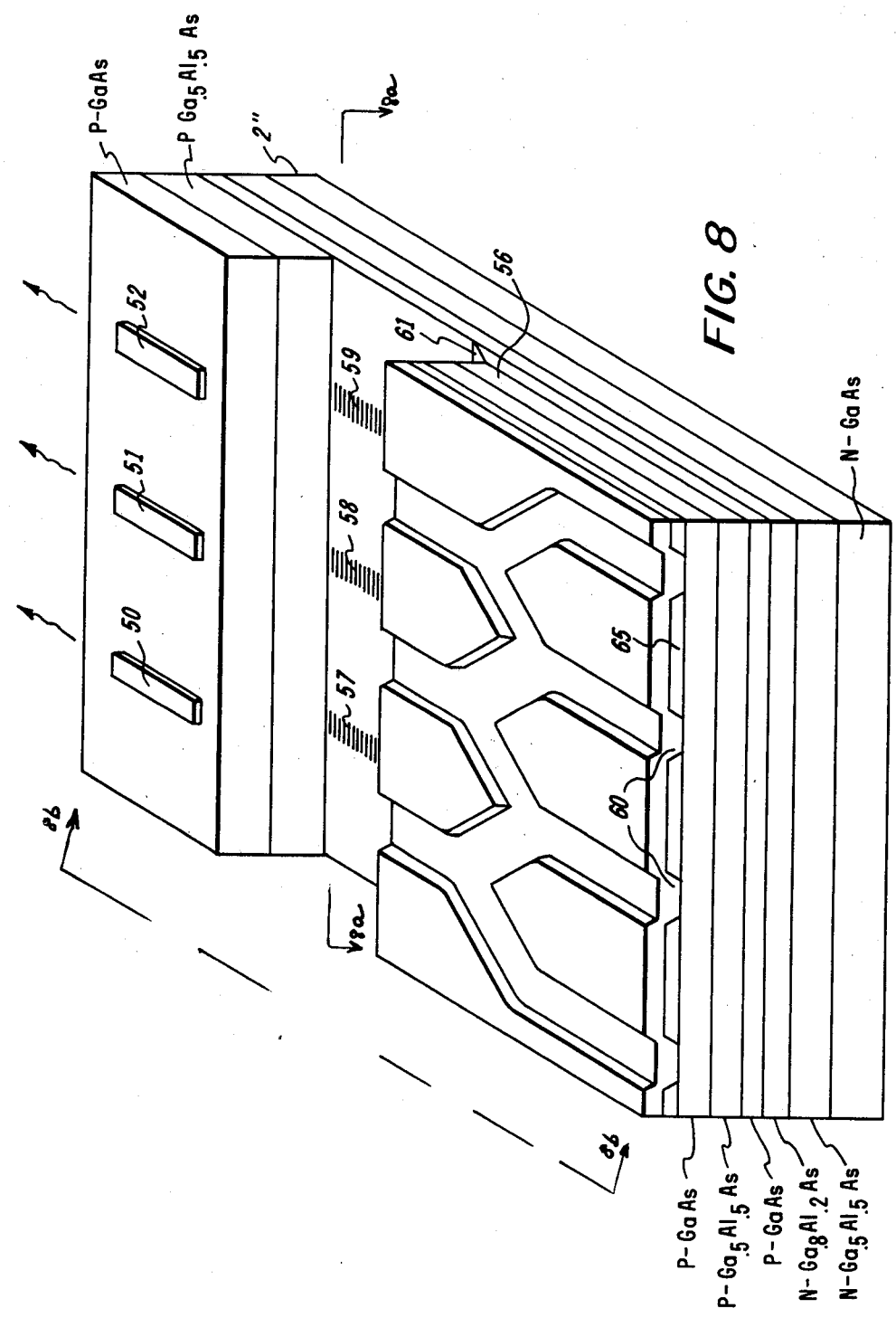
FIGS. 8, 8a and 8b depict an optical scanner having phasing elements external to the laser cavity.

In the scanners described heretofore the resonant cavities are provided by cleaved or mirrored faces of the semiconductor body and the phasing section or phase shifting elements act internally of the resonant cavities. Another type of scanner is one in which the phase shifting elements are external to the resonant cavities. FIG. 8 shows one embodiment of a laser scanner in which the phase shifting electrodes 50, 51 and 52 are external to the laser cavities.

Figure 8A:
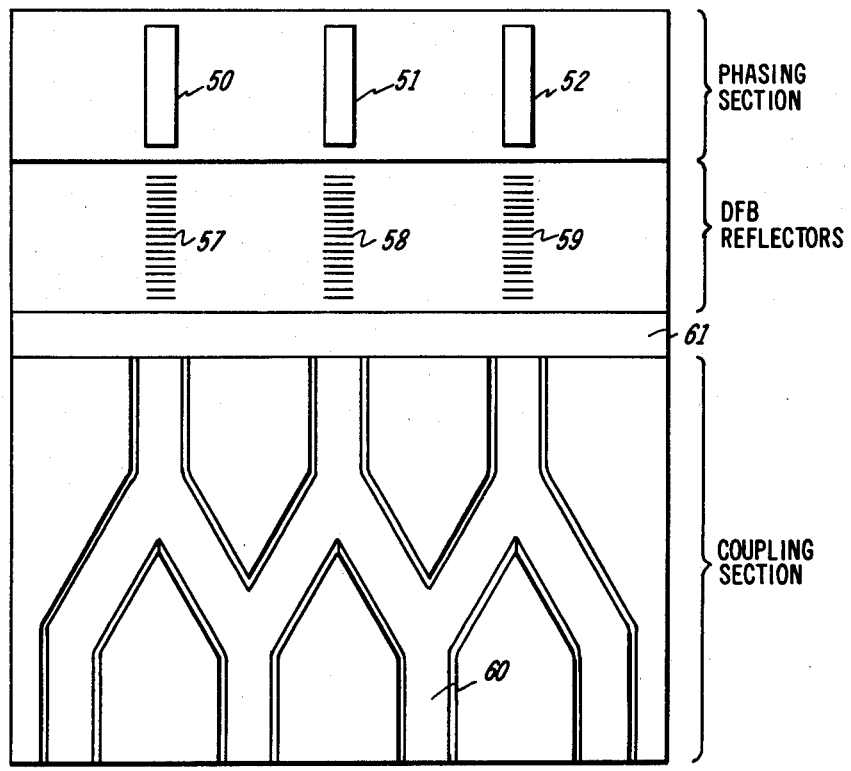
Figure 8B:
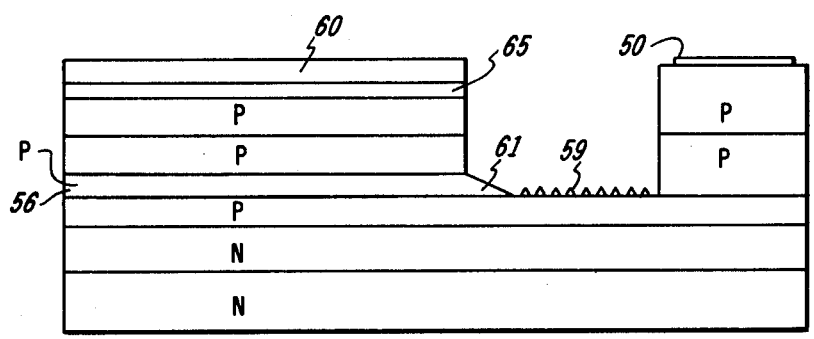

The scanner of FIG. 8 can have the layer configuration and material types shown. To provide for pumping of only portions of the active region layer 56 and coupling of those pumped portions of the laser active region, the insulating layer 65 is etched to provide a branching contact structure 60 (as best showing in FIGS. 8 and 8a) and hence a branching laser cavity structure within the active region 56. Feedback for lasing is provided by distributed feedback gratings 57, 58, and 59 which are taper coupled at 61 to the active region 56 as shown in FIG. 8b. Optically isolated or uncoupled output waveguides or regions beneath the phasing electrodes 50, 51 and 52 allow each light beam to be independently phased so that scanning can result. An antireflection coating can be used on the output face 2" to minimize coupling back into the laser. Many variations of the type and configuration of couplers, feedback mechanisms, coupled laser geometries (such as that of FIG. 5), and phasing electrodes can be used to achieve phase shifting external to the light sources.

With phasing provided external to the light sources, wavelength modulation is not achieved during phasing. Also, with external phasing the pump current is not amplitude modulated (as is the case with the scanner of FIG. 1) and hence the output beams do not have a relative amplitude modulation. Accordingly, external phasing is desirable where wavelength and amplitude control are desirable.

We claim:

1. A monolithic semiconductor device for providing a light beam scanner of the moving interference fringe type comprising:

a plurality of layers of semiconductor material, one of said layers being a light waveguide layer, said light waveguide layer and another of said layers in contact with said light waveguide layer being doped such that a rectifying junction is formed at the interface therebetween, means for forward biasing selected portions of said rectifying junction to produce an injection of minority carriers into selected portions of said light waveguide layer, means for establishing a plurality of resonant cavities each including at least one of said selected portions of said light waveguide to produce in conjunction with said means for forward biasing a plurality of laser beams, said resonant cavities being optically coupled, a light output region for each of said plurality of laser beams, said light output regions being disposed such that said laser beams are optically uncoupled at said light output regions, and means operatively associated with at least one of said resonant cavities for producing a relative phase change between light radiation in said resonant cavities whereby the far field interference fringes produced by said laser beams exiting said light output regions are spatially scanned.

2. The device of claim 1 wherein said means for producing a relative phase shift adjusts the bias applied to said resonant cavities.

3. The device of claim 1 wherein said light output regions are optically uncoupled due to their spatial separation.

4. The device of claim 1 wherein said light output regions are optically uncoupled due to a material having a low refractive index being disposed therebetween.

5. The device of claim 1 wherein said resonant cavities are optically coupled by providing each cavity with a common portion.

6. The device of claim 1 wherein said resonant cavities are optically coupled by disposing said resonant cavities in proximity to each other such that there is an overlapping of the radiation patterns of said light beams produced by said resonant cavities.

7. A monolithic semiconductor device for providing a scanning light beam comprising:

a plurality of optically resonant cavities, pumping means associated with each of said cavities for ininjecting minority carriers thereinto, said resonant cavities and said pumping means producing a laser beam in each of said resonant cavities, said resonant cavities being optically coupled, a light output area associated with each of said resonant cavities whereby a portion of each of said laser beams can exit each of said resonant cavities, said light output areas being optically uncoupled, and means for changing the relative phase of said portions of said laser beams whereby the interference fringe pattern produced by said portions of said laser beams is caused to scan.

8. The device of claim 7 wherein said means for changing the relative phase of said laser beams adjusts the relative magnitudes of said pump means.

9. The device of claim 7 wherein said resonant cavities are optically coupled by providing each cavity with a common portion.

10. The device of claim 7 wherein said resonant cavities are optically coupled by disposing said resonant cavities in proximity to each other such that there is an overlapping of the radiation patterns of said light beam produced by said resonant cavities.

11. The device of claim 7 wherein said light output regions are optically uncoupled due to their spatial separation.

12. The device of claim 7 wherein said light output regions are optically uncoupled due to a material having a low refractive index being disposed therebetween.

13. A monolithic semiconductor device for providing laser cavity wavelength modulation comprising:

a plurality of optically resonant cavities, pumping means associated with each of said cavities for injecting minority carriers thereinto, said resonant cavities and said pumping means producing a laser beam in each of said resonant cavities, said resonant cavities being optically coupled, a light output area associated with each of said resonant cavities whereby a portion of each of said light beams can exit each of said resonant cavities, said light output areas being optically uncoupled, and means for changing the relative phase of said portions of said laser beams whereby laser cavity wavelength modulation is achieved.

* * * * *